US010772185B1

(12) United States Patent
Chung

(10) Patent No.: US 10,772,185 B1
(45) Date of Patent: Sep. 8, 2020

(54) MODULAR BEAM AMPLIFIER

(71) Applicant: SpaceFab.US, Inc., Laguna Niguel, CA (US)

(72) Inventor: Randall M. Chung, Laguna Niguel, CA (US)

(73) Assignee: SpaceFab.US, Inc., Laguna Niguel, CA (US)

( * ) Notice: Subject to any disclaimer, the term of this patent is extended or adjusted under 35 U.S.C. 154(b) by 0 days.

(21) Appl. No.: 16/570,990

(22) Filed: Sep. 13, 2019

(51) Int. Cl.
| | |
|---|---|
| *H05H 9/04* | (2006.01) |
| *H03F 3/04* | (2006.01) |
| *H05H 7/08* | (2006.01) |
| *H05H 7/22* | (2006.01) |

(52) U.S. Cl.
CPC ............. *H05H 9/04* (2013.01); *H03F 3/04* (2013.01); *H05H 7/08* (2013.01); *H05H 7/22* (2013.01); *H05H 2007/082* (2013.01)

(58) Field of Classification Search
None
See application file for complete search history.

(56) References Cited

U.S. PATENT DOCUMENTS

| | | | | | |
|---|---|---|---|---|---|
| 1,991,236 | A | * | 2/1935 | Van De Graaff | H02N 1/12 310/308 |
| 2,215,155 | A | * | 9/1940 | Kallmann | H05H 5/06 313/359.1 |
| 2,230,473 | A | * | 2/1941 | Van De Graaff | H02N 1/12 310/308 |
| 2,517,260 | A | * | 8/1950 | Van De Graaff | H01J 5/06 315/15 |
| 2,579,440 | A | * | 12/1951 | Palmer | B03C 3/10 96/40 |
| 2,668,133 | A | * | 2/1954 | Brophy | C09J 167/06 156/275.5 |
| 2,875,394 | A | | 2/1959 | Cleland | |
| 3,133,227 | A | * | 5/1964 | Nunan | H01J 33/00 315/5.42 |
| 3,353,107 | A | * | 11/1967 | Van De Graaff | H05H 5/06 315/506 |
| 3,469,118 | A | * | 9/1969 | Ferry | H02N 1/08 310/309 |

(Continued)

FOREIGN PATENT DOCUMENTS

EP         0909894 A1    10/1998

*Primary Examiner* — Amy Cohen Johnson
*Assistant Examiner* — Srinivas Sathiraju
(74) *Attorney, Agent, or Firm* — Dinsmore & Shohl LLP; John P. Teresinski

(57) ABSTRACT

A modular beam amplifier for use in generating high power beams of particles in systems such as a spacecraft propulsion engine, comprising a distributed DC power generator including a plurality of DC generator cells connected in series to each other and a plurality of power taps at different points between the DC generator cells, an ion injector producing a particle beam and a plurality of amplifier modules in series with each other and coaxial with the particle beam. Each amplifier module in the plurality of amplifier modules includes a focus lens and a plurality of annular amplifier plates. Each amplifier plate pairs with and connects to a power tap. The plurality of DC generator cells is physically arranged in a serpentine arrangement of connected rows to minimize the physical length of the distributed DC power generator.

20 Claims, 5 Drawing Sheets

(56) References Cited

U.S. PATENT DOCUMENTS

| | | | | |
|---|---|---|---|---|
| 3,478,241 A | * | 11/1969 | Quinn | H05H 5/00 |
| | | | | 313/360.1 |
| 3,551,728 A | * | 12/1970 | Croitoru | B07B 13/00 |
| | | | | 315/3.5 |
| 3,634,783 A | * | 1/1972 | Rooney | H01P 1/264 |
| | | | | 333/22 R |
| 3,842,293 A | * | 10/1974 | Allen | H02N 1/08 |
| | | | | 310/309 |
| 3,889,138 A | * | 6/1975 | Allen | H02N 1/08 |
| | | | | 310/309 |
| 4,027,967 A | * | 6/1977 | Euler | G03G 15/263 |
| | | | | 399/159 |
| 4,825,646 A | * | 5/1989 | Challoner | B64G 1/281 |
| | | | | 244/169 |
| 5,357,747 A | * | 10/1994 | Myers | F03H 1/0081 |
| | | | | 313/341 |
| 5,845,880 A | | 12/1998 | Petrosov et al. | |
| 6,053,455 A | | 4/2000 | Price et al. | |
| 6,293,090 B1 | | 9/2001 | Olson | |
| 7,141,812 B2 | * | 11/2006 | Appleby | B29C 33/3842 |
| | | | | 250/505.1 |
| 7,400,094 B2 | * | 7/2008 | Meddaugh | H05H 9/04 |
| | | | | 315/111.61 |
| 8,836,247 B2 | * | 9/2014 | Yamamoto | H05H 9/042 |
| | | | | 315/500 |
| 9,148,944 B2 | * | 9/2015 | Tang | H05H 7/02 |
| 10,566,169 B1 | * | 2/2020 | Bennahmias | H01J 49/34 |
| 2010/0033115 A1 | * | 2/2010 | Cleland | H05H 5/02 |
| | | | | 315/501 |
| 2010/0253352 A1 | * | 10/2010 | Hulbert | H03D 7/1408 |
| | | | | 324/318 |
| 2012/0068632 A1 | * | 3/2012 | Heid | H05H 5/06 |
| | | | | 315/500 |
| 2012/0104176 A1 | * | 5/2012 | Ylonen | B64G 1/407 |
| | | | | 244/158.2 |

* cited by examiner

MODULAR BEAM AMPLIFIER

FIELD

The present disclosure generally relates to a modular beam amplifier for use in generating high power beams of particles in systems such as a spacecraft propulsion engine.

BACKGROUND

The present invention relates to a modular beam amplifier for use in generating high power beams of particles in systems such as a spacecraft propulsion engine, and more particularly to a lightweight and highly efficient spacecraft propulsion engine.

A typical ion linear accelerator using direct current (DC) voltage generators such as Cockcroft-Walton, Van de Graaff, or Pelletron circuits is described in U.S. Pat. No. 2,215,155. An insulated pipe containing a vacuum has a series of metal tubes or annular discs spaced at intervals down the pipe, each tube or disc at a progressively higher voltage. Ions are injected at the low voltage end and accelerated in stages by the electric field in the gap between each tube or disc. The acceleration is proportional to the total voltage between the low voltage end and the high voltage end of the pipe. The intermediate voltages for each tube or disc may be set by individual voltage generators, or there may be a single large voltage generator and the intermediate voltages set by resistors, connected as a series of voltage divider circuits. This linear accelerator will amplify or increase the energy of the ions from a lower energy when entering the accelerator to a higher energy when exiting the accelerator.

Previous approaches to generating very high DC voltages for linear accelerators have used Cockcroft-Walton circuits, described in U.S. Pat. No. 2,875,394, or Van de Graaff generators, described in U.S. Pat. No. 1,991,236, or the Pelletron generator described in U.S. Pat. No. 3,469,118. These types of circuits can generate DC voltages of thousands to millions of volts.

The Cockcroft-Walton circuit does not have any moving parts, but there are disadvantages in using it for generating high voltages, especially for spacecraft applications. For one thing, the DC voltage generated will have a ripple voltage, and the ripple voltage will get higher and higher as the number of diode/capacitor ladder stages increases. A high ripple voltage makes it difficult to focus a charged particle beam in a linear accelerator into a narrow particle beam. Most Cockcroft-Walton circuits will have 3 to 20 circuit stages. In the case where there are 20 circuit stages, the diodes and capacitors must have voltage ratings of at least 50,000 volts for each million volts of output. It is difficult and expensive to build or buy diodes and capacitors rated for that high of a voltage. In addition, the voltage regulation drops significantly as more ladder stages are added. This makes the Cockcroft-Walton approach heavy and expensive, which makes it inappropriate for use in spacecraft propulsion applications.

Van de Graaf and Pelletron generators are electromechanical mechanisms that require motors and moving belts or chains to generate high voltage, and they are impractical in generating more than a few kilowatts of power. These types of generators are not well suited for high voltage spacecraft power applications because of their weight and lack of long term reliability due to the continuously moving parts.

Other approaches to linear particle accelerators use AC voltages, typically at radio frequencies, as described in U.S. Pat. No. 3,133,227. The AC approach can generate extremely high voltage energy particle beams without the need to insulate against high DC voltages, but the existing implementations of this type of accelerator are too inefficient, heavy, and expensive to use in space propulsion applications.

There are also several types of existing electrostatic ion engine designs such as the gridded electrostatic ion thruster described in U.S. Pat. No. 4,825,646, the Hall effect thruster described in U.S. Pat. No. 5,845,880, and the field emission thruster described in U.S. Pat. No. 6,053,455. None of them operate with voltages above 105,000 volts, which limits their fuel consumption (specific impulse) performance. All existing designs use voltage converters or regulators between the main portion of the ion engine and the power source, which is usually a solar panel array, which increases the system weight and cost, and limits their system efficiency. In addition, all of the voltage converters or regulators are located in the main body of the satellite, resulting in heat buildup there which must be removed by thermal conductors or thermal radiators, especially for high power ion engines.

There is also a type of ion drive where the solar panels are directly connected to the ion drive grids as described by European Patent EP 0909894 A1. However, since grids are still used for accelerating the ions, their design suffers from increased grid erosion as the accelerating voltage is increased. Grid erosion is the major limit on the operational lifetime of gridded ion engines. Because of grid erosion, the number of grids is limited to only three or four.

Another type of ion engine is the VASIMR described in U.S. Pat. No. 6,293,090, which is an electromagnetic thruster which uses radio waves to generate a high temperature plasma and magnetic fields to form a nozzle. The latest embodiment requires the use of superconducting magnets, which increases the weight and requires large amounts of power for refrigeration to keep the nozzle magnets at a superconducting temperature.

It would be desirable to find a spacecraft ion engine that operates efficiently at high voltages without being overly encumbered by weight, cost, or cooling requirements.

BRIEF SUMMARY OF THE EMBODIMENTS

Disclosed and claimed herein is a modular beam amplifier for use in generating high power beams of particles in systems such as a spacecraft propulsion engine. In one embodiment, the modular particle beam amplifier comprises a distributed DC power generator including a plurality of DC generator cells connected in series to each other and a plurality of power taps at different points between the DC generator cells, an ion injector producing a particle beam and a plurality of amplifier modules in series with each other and coaxial with the particle beam. In one embodiment, each amplifier module in the plurality of amplifier modules includes a focus lens and a plurality of amplifier plates. In one embodiment, each amplifier plate in the plurality of amplifier plates pairs with and connects to a power tap in the plurality of power taps of the distributed DC power generator. In one embodiment, each amplifier plate in the plurality of accelerator plates includes a hole for the particle beam to pass through. In one embodiment, the plurality of DC generator cells is physically arranged in a serpentine arrangement of connected rows with a narrow end gap and a wide end gap between each adjacent row such as to minimize the physical length of the distributed DC power generator. In one embodiment, the modular particle beam amplifier accelerates a particle beam by means of an electric field between the amplifier plates in the plurality of amplifier plates.

In another disclosed embodiment, the ion injector sources propellant from a propellant tank to ionize the propellant and produce the particle beam. In another disclosed embodiment, the modular particle beam amplifier balances the charge of the particle beam by means of an electron emitter.

In another disclosed embodiment, at least one amplifier module of the modular particle beam amplifier includes a means of re-focusing the particle beam. In another disclosed embodiment, the focus lens of at least one amplifier module of the modular particle beam amplifier is implemented with at least one lens from the set of a magnetic lens and an electrostatic lens. In another disclosed embodiment, the focus lens of at least one amplifier module of the modular particle beam amplifier provides a variable focus control. In another disclosed embodiment, the focus lens of at least one amplifier module of the modular particle beam amplifier provides fine adjustment of the particle beam using electromagnetic means.

In another disclosed embodiment, at least one amplifier module of the modular particle beam amplifier includes a detector to provide particle beam focus and alignment information to the focus lens of the at least one amplifier module.

In another disclosed embodiment, the modular particle beam amplifier includes at least one tilt unit between amplifier modules to provide a mechanical alignment function.

In another disclosed embodiment, each amplifier module in the plurality of amplifier modules is electrically isolated from the other amplifier modules in the plurality of amplifier modules except for through the distributed DC power generator. In another disclosed embodiment, at least one amplifier module in the plurality of amplifier modules wirelessly communicates with at least one other amplifier module in the plurality of amplifier modules.

Also disclosed and claimed herein is a distributed DC power generator for a modular particle beam amplifier including a plurality of DC generator cells connected in series to each other and a plurality of power taps at different points between the DC generator cells. In one embodiment, the plurality of DC generator cells is physically arranged in a serpentine arrangement of connected rows with a narrow end gap and a wide end gap between each adjacent row such as to minimize the physical length of the distributed DC power generator.

In another disclosed embodiment, the plurality of power taps is arranged to provide specific voltage and current values between each sequential pair of power taps.

In another disclosed embodiment, at least one DC generator cell in the plurality of DC generator cells is a solar cell photodiode that generates power when illuminated by natural or artificial sources of light. In another disclosed embodiment, the solar cell photodiode is composed of at least one of silicon, gallium arsenide, Copper Indium Galium Selenide (CIGS), and any other photovoltaic material.

In another disclosed embodiment, at least one DC generator cell in the plurality of DC generator cells is a rectenna that generates power when it receives radio frequency energy of a particular frequency.

In another disclosed embodiment, the distributed DC generator cell is mounted on an insulating substrate comprised of at least one non-conductive material. In another disclosed embodiment, the insulating substrate includes at least one material from the set of plastic polyimide, Teflon, glass, ceramic, and fiberglass-reinforced plastic.

In another disclosed embodiment, the minimum distance of the narrow end gap is set by the breakdown voltage of the insulating substrate and the voltage difference between two adjacent DC generator cells. In another disclosed embodiment, the minimum distance of the wide end gap is set by the breakdown voltage of the insulating substrate and the highest voltage difference between two rows of DC generator cells. In another disclosed embodiment, the narrow end gap and the wide end gap are equal in distance.

In another disclosed embodiment, at least one subset of DC generator cells includes a crowbar circuit block in parallel with the at least one subset of DC generator cells. In another disclosed embodiment, the crowbar circuit is designed to short out the at least one subset of DC generator cells under startup or error conditions. In another disclosed embodiment, the crowbar circuit is designed to short out the at least one subset of DC generator cells in order to adjust voltage levels along the length of the distributed DC power generator.

Other aspects, features, and techniques will be apparent to one skilled in the relevant art in view of the following detailed description of the embodiments.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein:

FIG. 3A is a graphic illustration of an exemplary embodiment of a distributed DC power generator panel, wherein a plurality of DC generator cells is physically arranged in a serpentine arrangement of connected rows with a narrow end gap and a wide end gap between each adjacent row such as to minimize the physical length of the distributed DC power generator. FIG. 3B is a graphic illustration of an exemplary embodiment of a distributed DC power generator panel, wherein there is a constant gap value between two adjacent rows along the length of the rows. FIG. 3C is a graphic illustration of an exemplary embodiment of a distributed DC power generator panel, wherein a first and second set of crowbar circuits are arranged to short-circuit segments of the distributed DC power generator panel in order to regulate the voltage values at various points along the distributed DC power generator panel.

DETAILED DESCRIPTION OF THE EXEMPLARY EMBODIMENTS

Overview and Terminology

One aspect of the disclosure is directed to providing a modular beam amplifier for use in generating high power beams of particles in systems such as a spacecraft propulsion engine.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive. Further, it should be noted that while the plurality depicted in this document are depicted as having a fixed member count, the plurality depicted should be interpreted as exemplary and not limiting in regards to member count.

Reference throughout this document to "one embodiment," "certain embodiments," "an embodiment," or similar term means that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation.

Exemplary Embodiments

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
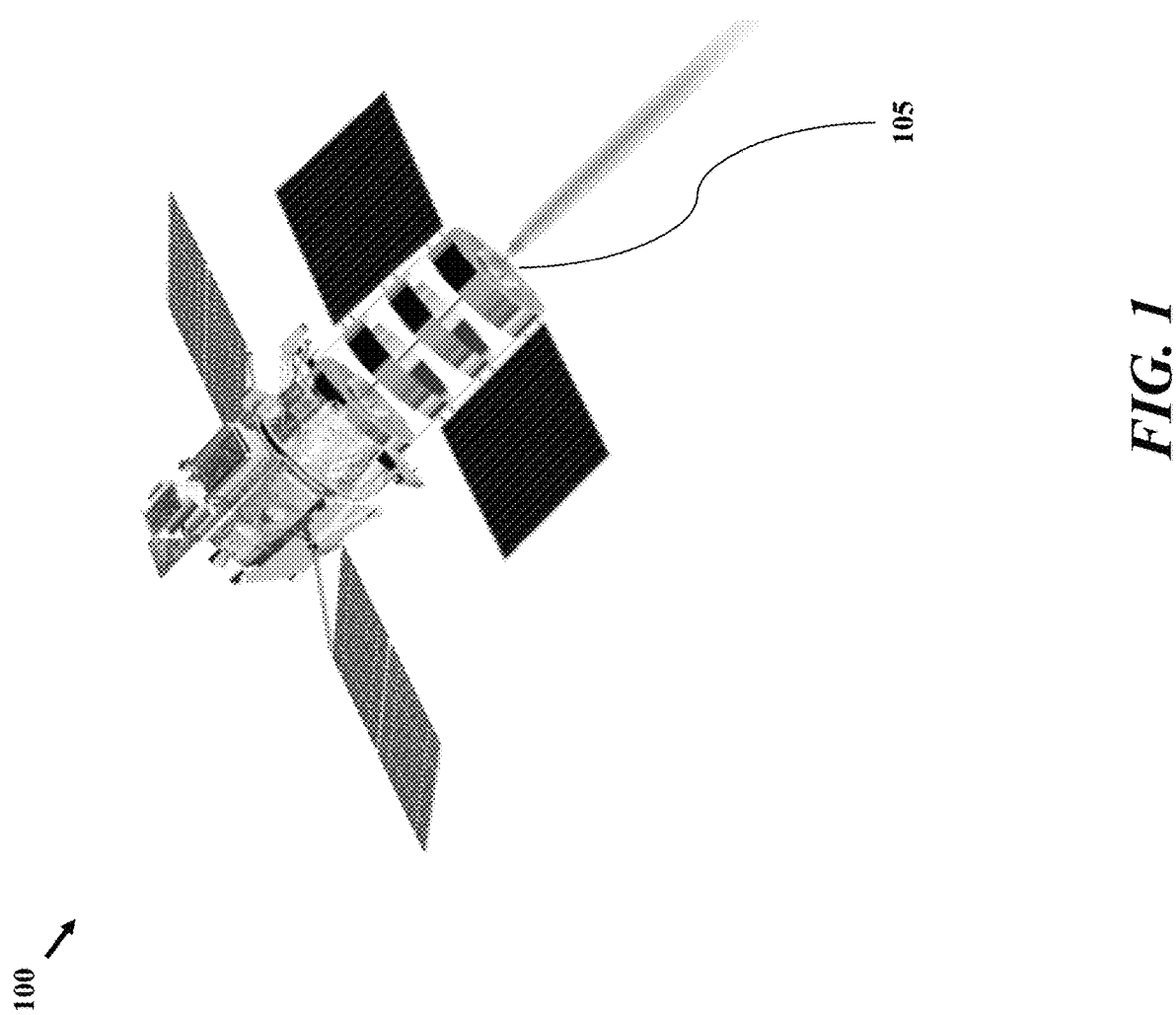
FIG. 1 is a perspective view of an exemplary embodiment of a spacecraft including a modular particle beam amplifier.

FIG. 1 is a perspective view of an exemplary embodiment of a spacecraft 100 including a modular particle beam amplifier 105. In one embodiment, the spacecraft 100 uses the modular particle beam amplifier 105 as a propulsion engine, using particles emitted by the modular particle beam amplifier 105 to provide thrust. The spacecraft 100 depicted is exemplary; the modular particle beam amplifier 105 described in this document may be used on any spacecraft with need of a lightweight and efficient propulsion engine.

In one embodiment, the spacecraft 100 including the modular particle beam amplifier 105 may be configured to be launched from a planetary surface into an escape trajectory. In one embodiment, the modular particle beam amplifier 105 may be launched in a compact form, then unfurled to full length once the modular particle beam amplifier 105 has exited the atmosphere.

Figure 2:
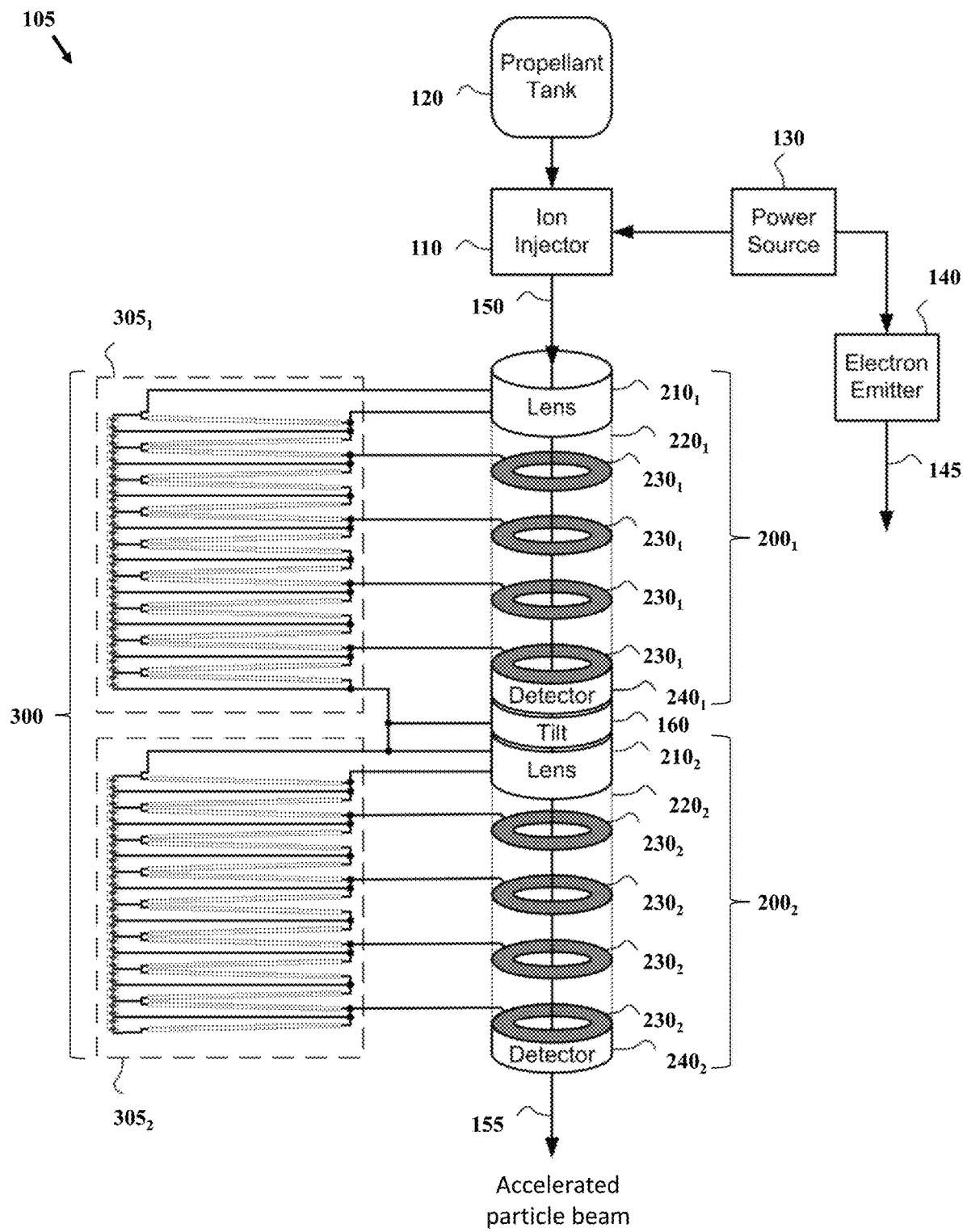
FIG. 2 is a graphic illustration of an exemplary embodiment of a modular particle beam amplifier.

FIG. 2 is a graphic illustration of an exemplary embodiment of a modular particle beam amplifier 105. In one embodiment, the modular particle beam amplifier 105 includes an ion injector 110, a propellant tank 120, a power source 130, an electron emitter 140, a plurality of amplifier modules $200_{1-2}$, and a distributed DC power generator 300 including a plurality of distributed DC power generator panels $305_{1-2}$. In one embodiment, the ion injector 110 takes in non-ionized propellant from the propellant tank 120 and produces a low energy particle beam 150 by ionizing the propellant. The non-ionized propellant may be, for example, xenon gas, hydrogen gas, or any other material which can be ionized. In one embodiment, the modular particle beam amplifier 105 uses an electron emitter 140 to produce an electron beam 145 that is used to balance the charge of the accelerated particle beam 155. In one embodiment, the electron beam 145 is dissipated in a manner such that the electron beam 145 does not affect the propulsion of the spacecraft 100 or the motion of the particle beam 150.

In one embodiment, each amplifier module 200 in the plurality of amplifier modules $200_{1-2}$ includes a focus lens 210, an amplifier structure 220, a plurality of amplifier plates 230, and a detector 240. In one embodiment, each amplifier module 200 is coaxial with the particle beam 150 and in series with the other amplifier modules 200 in the plurality of amplifier modules $200_{1-2}$ such that the plurality of amplifier modules $200_{1-2}$ forms a continuous path from the ion injector 110 to the end of the modular particle beam amplifier 105.

In the case of any beam of charged particles, the particles comprising the beam may have some initial velocity perpendicular to the direction of travel for the particle beam 150. In addition, the charged particles in the beam all would have the same charge, positive or negative. Since particles with the same charges repel each other, the particle beam would tend to get wider and wider. To counter these effects, at least one of the amplifier modules 200 in the plurality of amplifier modules $200_{1-2}$ may have a means of re-focusing a wide beam back down to a narrow beam. In one embodiment, the focus lens 210 of at least one amplifier module 200 in the plurality of amplifier modules $200_{1-2}$ shapes and collimates the particle beam 150 into an approximately circular beam with minimal divergence. In one embodiment, the focus lens 210 of at least one amplifier module 200 in the plurality of amplifier modules $200_{1-2}$ is implemented with at least one lens from the set of a magnetic quadrupole lens, a hextupole lens, and an electrostatic Einzel lens. In one embodiment, circuitry in the focus lens 210 of at least one amplifier module 200 in the plurality of amplifier modules $200_{1-2}$ may provide a variable focus control to compensate for voltage variation in the distributed DC power generator 300, or for different ion propellants with different particle masses or charge number.

The addition of a focus lens 210 or some other beam re-focusing circuit within an amplifier module 200 may allow an unlimited number of amplifier modules 200 to be connected together while keeping the particle beam 150 narrow enough to pass through the annulus of each amplifier plate 230. Plate erosion is prevented by having all or almost all of the energetic charged particles pass through the plate annulus and not hitting the amplifier plates 230 themselves, thus greatly extending the lifetime of the modular particle beam amplifier 105. There may be two types of amplifier module 200, one type without a beam re-focusing circuit and another type with a beam re-focusing circuit.

In one embodiment, the particle beam 150 then passes through an electrostatically driven acceleration section of at least one amplifier module 200 in the plurality of amplifier modules $200_{1-2}$, wherein the electrostatically driven acceleration section is composed of a plurality of metal amplifier plates 230 separated at a distance from each other, wherein each amplifier plate 230 has a hole in the middle of it for the particle beam 150 to travel through. In one embodiment, each amplifier plate 230 in the plurality of amplifier plates 230 is in the shape of an annulus—a round disk with a hole in the middle. In one embodiment, each amplifier plate 230 in the plurality of amplifier plates 230 is made of an electrically conductive material, such as a metal foil. In one embodiment, each amplifier plate 230 in the plurality of amplifier plates 230 does not carry much current and so can be made thin and light. In one embodiment, each amplifier plate 230 in the plurality of amplifier plates 230 is in series with the other amplifier plates 230 in the plurality of amplifier plates 230 and coaxial with the particle beam 150.

In one embodiment, the current of each single amplifier plate 230 in the plurality of amplifier plates 230 will always be lower than the current of the particle beam 150 travelling through the center of the plurality of amplifier plates 230.

In one embodiment, if the at least two amplifier plates 230 have a voltage difference and the proper electrical polarity between them, then the particle beam 150 is accelerated by the electrical field between the plurality of amplifier plates 230. In one embodiment, if the particle beam 150 is focused well, the particle beam 150 will travel through the central hole of each amplifier plate 230 without impinging on any of the amplifier plates 230. This may help avoid the erosion problem of a gridded ion engine design.

In one embodiment, the detector 240 is used to provide information regarding the focus and alignment of the particle beam 150 to the focus lens 210. In one embodiment, the detector 240 is an electrically isolated annular metal plate, wherein if particles strike the plate, the plate voltage will change. This embodiment may be an implementation of a Faraday cup. In another embodiment, the detector 240 is an annular plate that is coated with a fluorescent or similar material that lights up when struck by particles. In one embodiment, an optical sensor may be used to measure any fluorescence of the struck annular plate as a way to gauge the focus or alignment of the particle beam 150.

In one embodiment, the modular particle beam amplifier 105 includes at least one tilt unit 160 between amplifier modules 200 to provide a mechanical alignment function. In one embodiment, the focus lens 210 of at least one amplifier module 200 can provide a fine adjustment of the particle beam 150 using electromagnetic means, while the at least one tilt unit 160 may provide a coarse adjustment of the particle beam 150. In one embodiment, the at least one tilt unit 160 may mechanically couple at least two of the amplifier modules 200 in the plurality of amplifier modules $200_{1-2}$ together.

In one embodiment, the amplifier structure 220 is made of an insulating material. In one embodiment, the amplifier structure 220 holds the plurality of amplifier plates 230 in place. The amplifier structure 220 may have a tube shape, or the amplifier structure 220 may be an open structure of insulating beams or girders. In one embodiment, the amplifier structure 220 may provide structural support and attachment points for elements of the distributed DC power generator 300.

In one embodiment, each of the amplifier modules 200 in the plurality of amplifier modules $200_{1-2}$ may be assembled together in series to accelerate the particle beam 150 to arbitrarily high voltages. In one embodiment, the particle beam 150 exits the last amplifier module 200 in the series as an accelerated particle beam 155. In one embodiment, if the accelerated particle beam 155 is unimpeded, it provides thrust to the spacecraft 100.

In one embodiment, at least one amplifier module 200 in the plurality of amplifier modules $200_{1-2}$ is electrically isolated from the other amplifier modules 200 in the plurality of amplifier modules $200_{1-2}$ except for through the distributed DC power generator 300. In one embodiment, the at least one amplifier module 200 in the plurality of amplifier modules $200_{1-2}$ wirelessly communicates with at least one other amplifier module 200 in the plurality of amplifier modules $200_{1-2}$. In one embodiment, the wireless communication may be at least one of optical signaling, high voltage transformer signaling, radio, or some other wireless means of communication.

In one embodiment, the plurality of amplifier modules $200_{1-2}$ and the distributed DC power generator 300 may be arranged so that the plurality of amplifier modules $200_{1-2}$ and the distributed DC power generator 300 have approximately the same length. This arrangement may enable the easy extraction of intermediate voltages for powering the modular particle beam amplifier 105 in stages, as well as the intermediate voltages for powering the beam re-focus circuitry. This physical arrangement may also keep wires with large voltage differences from being too close to each other. If high voltage lines are not kept separated far enough, a destructive electrical arc may be generated. This is a complication for existing ion engine designs where the power supply voltages from solar panels must be limited, typically to under 400 volts, to prevent arcing. In one embodiment, high electric fields are prevented by connecting the taps $320_{1-4}$ (see FIGS. 3A-3C) of the DC power generator 300 physically directly across to each amplifier module 200, allowing the voltages between power taps 320 to be thousands of volts or more. On the other hand, the re-focusing circuitry may operate on lower voltages, such as 100 volts or lower.

In one embodiment, the plurality of amplifier modules $200_{1-2}$ and the distributed DC power generator 300 may be built as a separate assembly at the end of the spacecraft 100, extending externally from the spacecraft 100. This embodiment may have the advantage of distributing the amplifier circuitry along its length and distributing the heat load of the modular particle beam amplifier 105 so that it is not concentrated in one location, thereby reducing or eliminating the need for a separate thermal radiator.

The primary embodiment of the modular particle beam amplifier 105 is as a spacecraft propulsion engine, but the modular particle beam amplifier 105 described may be implemented in other applications. In one embodiment, the modular particle beam amplifier 105 may be used to amplify ions or other charged particles into high energy particle beams. In one embodiment, the modular particle beam amplifier 105 may be used to accelerate electrons or to amplify photons into high energy maser or laser beams. In one embodiment, if the accelerated particle beam 155 has sufficient energy (typically 1 billion electron volts for proton particle beams), then the accelerated particle beam 155 can be directed to a neutron spallation target for use in a fission reactor based Accelerator Driven System.

Figure 3A:
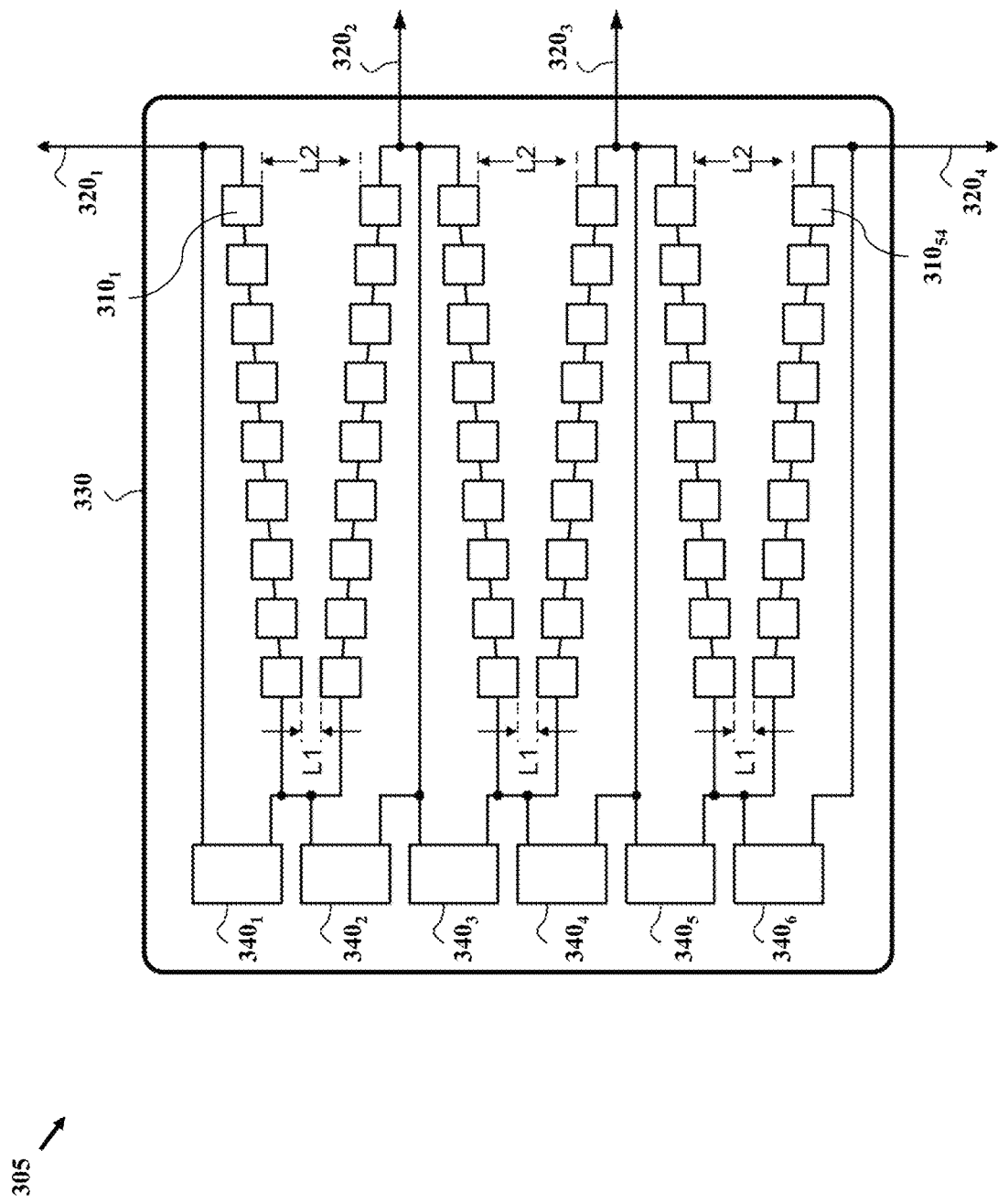
FIGS. 3A-3C are graphic illustrations of an exemplary embodiment of a distributed DC power generator panel.
Figure 3B:
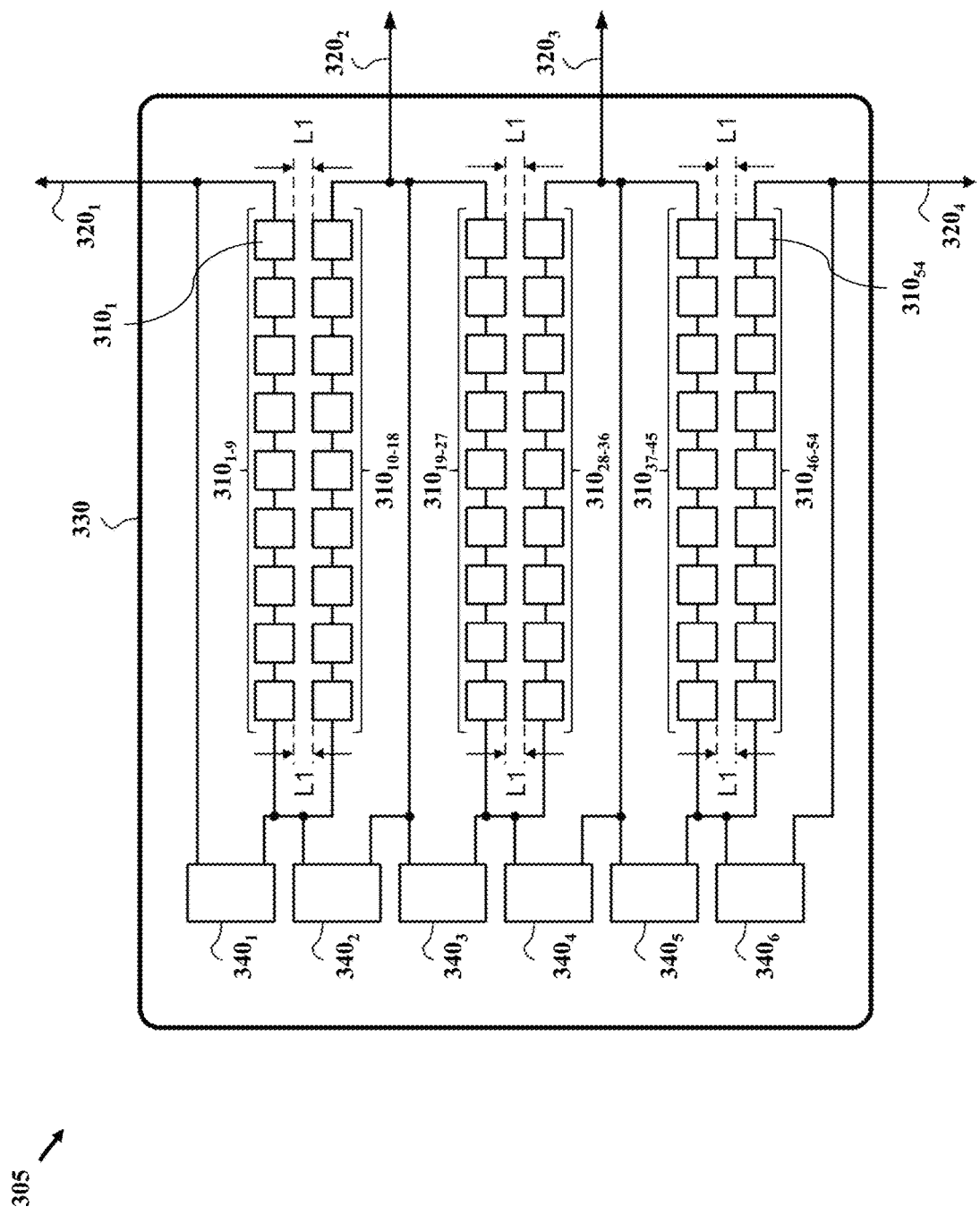
Figure 3C:
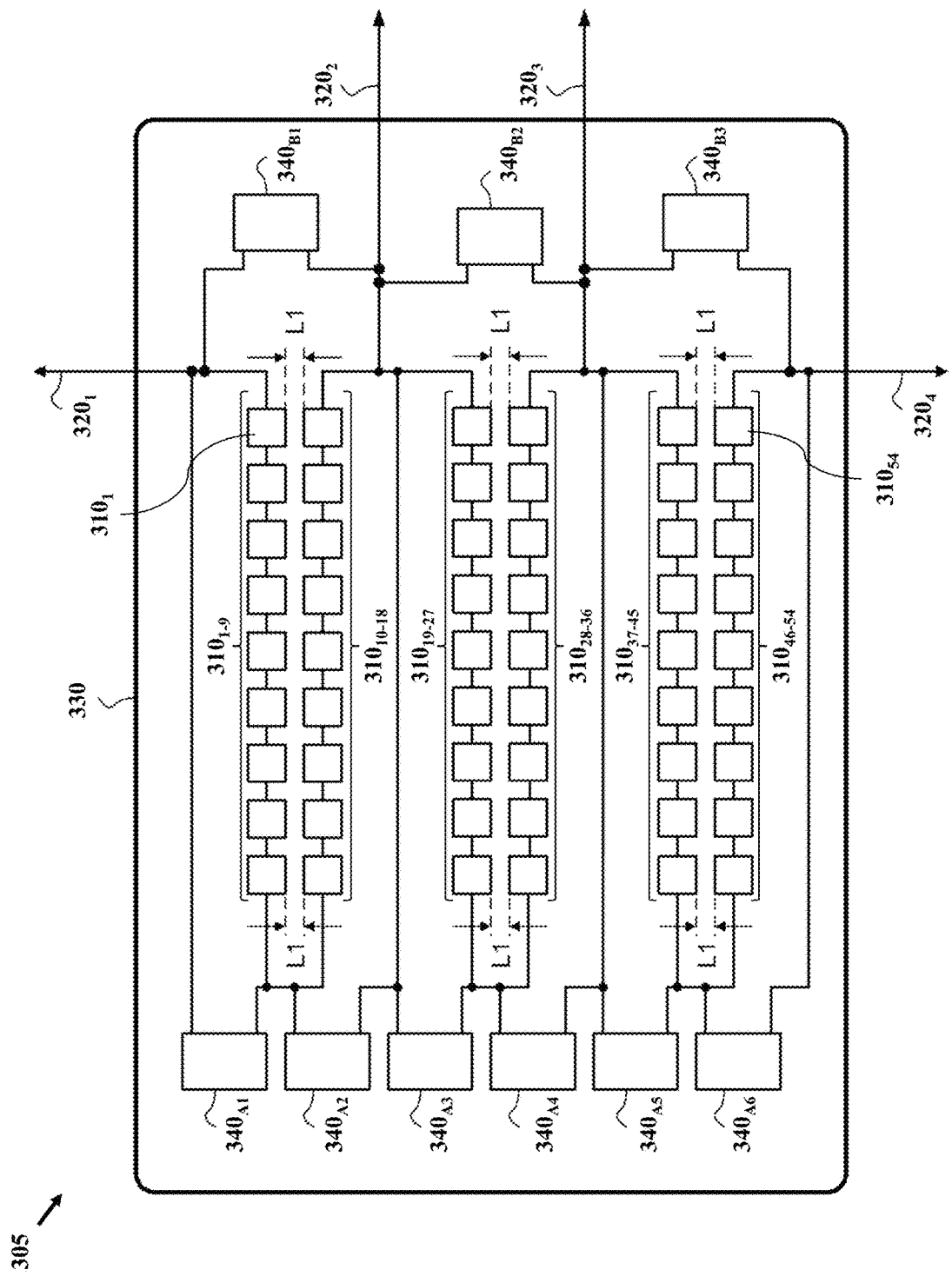

FIGS. 3A-3C are graphic illustrations of an exemplary embodiment of a distributed DC power generator panel 305. In one embodiment, the distributed DC power generator panel 305 provides the voltages for at least one of the following: the focus lens 210 of at least one of the amplifier modules 200, at least one accelerator plate 230 of at least one of the amplifier modules 200, the detector 240 of at least one of the amplifier modules 200, and at least one tilt unit 160.

In one embodiment, the distributed DC power generator panel 305 includes a plurality of DC generator cells $310_{1-54}$ connected in series to each other. In one embodiment, the distributed DC power generator panel 305 includes a plurality of power taps $320_{1-4}$ at different points between the DC generator cells 310 in the plurality of DC generator cells $310_{1-54}$. In one embodiment, the plurality of DC generator cells $310_{1-54}$ is arranged on an insulating substrate 330. In one embodiment, the insulating substrate 330 is flexible. The insulating substrate 330 may include at least one material from the set of plastic polyimide, Teflon, glass, ceramic, and fiberglass-reinforced plastic. The substrate 330 may also be composed at least in part of a rigid plate, or a hinged set of rigid plates including electrically insulating material. The use of electrically conductive material in the support structure could result in arcing from the DC generator cells 310 or power cell wiring to the support structure, so any supporting structure must be made at least in part of electrically non-conductive material such as plastic polyimide, Teflon, glass, fiberglass reinforced plastic, or similar material.

In one embodiment, at least one DC generator cell 310 in the plurality of DC generator cells $310_{1-54}$ is a solar cell photodiode that generates power when illuminated by natural or artificial sources of light. Each solar cell photodiode may generate a small voltage when illuminated by light such as sunlight, around 0.6 volts when the solar cell photodiode is made of silicon or around 2.5 volts for III-V compound multi junction diodes made of gallium arsenide or similar material. The individual solar cell photodiodes may be discrete dice attached to the insulating substrate 330, or may be composed of a thin film material such as CIGS, a compound of copper, indium, gallium, and sulfur, patterned and deposited directly onto the substrate 330. The individual solar cell photodiodes may then be connected electrically in series using conventional methods such as wire bonds or printed circuit board technology. In addition to illumination by sunlight, the solar cell photodiodes may generate DC power when illuminated by artificial sources such as light from light emitting diodes (LED) or laser light, either with direct illumination or with light concentrated from a lens or mirror.

Terrestrial solar panels such as those described in U.S. Pat. No. 6,968,654 are built as an array of solar cells connected in series or series/parallel, generally with a metal frame both for mechanical support and for lightning grounding purposes. The metal frame limits the maximum voltage that can be generated when connecting panels in series, and is typically 1000 volts or less. In one embodiment, to avoid any such voltage limitation, the distributed DC power generator panel 305 disclosed in this document does not have any metal conductive frame or metal structural member. All structural components of the distributed DC power generator panel 305 may instead be made of electrically non-conducting material.

In another disclosed embodiment, at least one DC generator cell 310 in the plurality of DC generator cells $310_{1-54}$ is a rectenna that generates power when it receives radio frequency energy of a particular frequency. Depending on the antenna circuit design, the generated DC voltage of the rectenna might be a few volts or 50 volts or more. U.S. Pat. No. 3,434,678 describes the rectifying antenna or rectenna, and how a practical rectenna can be composed of an array of multiple individual rectenna circuits. In a typical rectenna array, the elements would be arranged in a serial/parallel circuit, to limit the system output voltage to a thousand volts or less. As in the solar cell embodiment, the rectenna array may be arranged in a serpentine fashion to minimize the physical length of the array. In this and other embodiments, the frame of the distributed DC power generator panel 305 and the insulating substrate 330 are constructed using non-conductive material. The rectenna circuits may generate DC power when radio frequency energy of a particular frequency is transmitted to them, perhaps by a radio frequency transmitter or by a maser (a device similar to a laser but operating at microwave frequencies). There may be situations where it is more efficient to use radio frequency power transmission rather than light powered transmission.

FIG. 3A is a graphic illustration of an exemplary embodiment of a distributed DC power generator panel 305, wherein the plurality of DC generator cells $310_{1-54}$ is physically arranged in a serpentine arrangement of connected rows with a narrow end gap L1 and a wide end gap L2 between each adjacent row such as to minimize the physical length of the distributed DC power generator 300. In one embodiment, the minimum distance of the narrow end gap L1 is set by the breakdown voltage of the insulating substrate and the voltage difference between two adjacent DC generator cells 310. In one embodiment, the minimum distance of the wide end gap L2 is set by the breakdown voltage of the insulating substrate and the highest voltage difference between two rows of DC generator cells 310. In one embodiment, the DC generator cells 310 in series between each row's end cells (the cells at the narrow end gap and the cells at the wide end gap) are then arranged so that the spacing between each row of cells decreases linearly. The embodiment of the serpentine pattern shown in FIGS. 3A-3C is designed to minimize the length of the DC power generator panel 305 without exceeding the breakdown voltage of the insulating substrate 330.

In one embodiment, at least one of the power taps 320 in the plurality of power taps $320_{1-4}$ (for example, power taps $320_2$ and $320_3$ of FIGS. 3A-3C) connects to an external block. In one embodiment, at least one of the power taps 320 in the plurality of power taps $320_{1-4}$ has an electrical connection to at least one component of the modular particle beam amplifier 105 such as the focus lens 210 of at least one amplifier module 200, the detector 240 of at least one amplifier module 200, and at least one tilt unit 160. In one embodiment, at least one of the power taps 320 in the plurality of power taps $320_{1-4}$ (for example, power taps $320_1$ and $320_4$ of FIGS. 3A-3C) connects to another distributed DC power generator panel 305.

In one embodiment, the plurality of power taps $320_{1-4}$ is arranged to provide specific voltage and current values between each sequential pair of power taps 320. In one embodiment, this provision of specific voltage and current values is accomplished by changing where a power tap 320 connects in the series of DC generator cells 300. For example, placing a first power tap $320_1$ at the start of the series of DC generator cells (before the first DC generator cell $310_1$) and placing a second power tap $320_2$ between the tenth DC generator cell $310_{10}$ and the eleventh DC generator cell $310_{11}$ results in a different voltage differential than the voltage differential that results from placing the second power tap $320_2$ between the nineteenth DC generator cell $310_{19}$ and the twentieth DC generator cell $310_{20}$.

In one embodiment, the rows of DC power generator cells 310 are arranged so that they are approximately orthogonal to the particle beam 150, rather than approximately parallel to the particle beam 150. In one embodiment, the orthogonal arrangement of rows may provide an advantage in connecting at least one of the power taps 320 in the plurality of power taps $320_{1-4}$ to the at least one amplifier plate 230. In one embodiment, the orthogonal arrangement of rows may minimize the length of the distributed DC power generator panel 305.

In one embodiment, the distributed DC power generator panel 305 includes at least one crowbar circuit 340 that connects in parallel to a subset of the DC generator cells 310, such as a row of DC generator cells 310. In one embodiment, the at least one crowbar circuit 340 is designed to short out the subset of DC generator cells 310 under startup or error conditions, such as if electricity arcing is detected. In one embodiment, a plurality of crowbar circuits $340_{1-6}$ is connected such that each subset of DC generator cells 310 with a crowbar circuit 340 in parallel totals to the complete set of DC generator cells 310 on the distributed DC power generator panel 305. In one embodiment, at least one crowbar circuit 340 is under centralized control. In one embodiment, the at least one crowbar circuit 340 under centralized control communicates with a centralized control system by means of radio or optical links.

FIG. 3B is a graphic illustration of an exemplary embodiment of a distributed DC power generator panel 305, wherein there is a constant gap value L1 between two adjacent rows along the length of the two adjacent rows. This embodiment is analogous to the embodiment depicted in FIG. 3A, wherein the narrow end gap L1 and the wide end gap L2 are the same distance.

FIG. 3C is a graphic illustration of an exemplary embodiment of a distributed DC power generator panel 305, wherein a first and second set of crowbar circuits $340_A$ and $340_B$ are arranged to short-circuit segments of the distributed DC power generator panel 305 in order to regulate the voltage values at various points along the distributed DC power generator panel. In one embodiment, at least one of the crowbar circuits in the first set of crowbar circuits 340 between two power taps 320 may close in order to reduce the voltage between the two power taps 320. For example, if a first crowbar circuit $340_{A1}$ closes, the first row of DC generator cells $310_{1-9}$ is shorted and the voltage between a first power tap $320_1$ and a second power tap $320_2$ is reduced to the voltage provided by the remaining unshorted DC generator cells $310_{10-18}$. In one embodiment, at least one of the crowbar circuits in the second set of crowbar circuits $340_B$ between two power taps 320 may close in order to completely short out the voltage between the two power taps 320. For example, if a second crowbar circuit $340_{B1}$ closes, the first and second row of DC generator cells $310_{1-9}$ and $310_{10-18}$ are both shorted out and the voltage difference between the first power tap $320_1$ and the second power tap $320_2$ is zero.

In one embodiment, a controller may open and close crowbar circuits from the first set of crowbar circuits $340_A$ or the second set of crowbar circuits $340_B$ to achieve a variety of voltage levels between power taps 320.

In one embodiment, the distributed DC power generator 300 may be launched in a folded or rolled up form, then unfurled to full length when in space.

While this disclosure has been particularly shown and described with references to exemplary embodiments thereof, it will be understood by those skilled in the art that various changes in form and details may be made therein without departing from the scope of the claimed embodiments.

What is claimed is:

1. A modular particle beam amplifier, comprising: a distributed direct current (DC) power generator including a plurality of DC generator cells connected in series to each other and a plurality of power taps at different points between the DC generator cells; an ion injector producing a particle beam; and a plurality of amplifier modules in series with each other and coaxial with the particle beam; wherein each amplifier module in the plurality of amplifier modules includes a focus lens and a plurality of amplifier plates; wherein each amplifier plate in the pluralities of amplifier plates pairs with and connects to a power tap in the plurality of power taps of the distributed DC power generator; wherein each amplifier plate in the pluralities of accelerator plurality of amplifier plates includes a hole for the particle beam to pass through; wherein the plurality of DC generator cells is physically arranged in a serpentine arrangement of connected rows with a narrow end gap and a wide end gap between each adjacent row such as to minimize the a physical length of the distributed DC power generator; and wherein the modular particle beam amplifier accelerates a particle beam by means way of an electric field between the amplifier plates in the pluralities of amplifier plates.

2. The modular particle beam amplifier of claim 1, wherein the modular particle beam amplifier balances charge of the particle beam by way of an electron emitter.

3. The modular particle beam amplifier of claim 1, wherein at least one amplifier module of the modular particle beam amplifier includes a means of re-focusing the particle beam.

4. The method modular particle beam amplifier of claim 1, wherein the refocusing of at least one amplifier module of the modular particle beam amplifier is implemented with at least one lens from the set of a magnetic lens and an electrostatic lens.

5. The method modular particle beam amplifier of claim 1, wherein the refocusing of at least one amplifier module of the modular particle beam amplifier provides a variable focus control.

6. The method modular particle beam amplifier of claim 1, wherein the refocusing of at least one amplifier module of the modular particle beam amplifier provides fine adjustment of the particle beam using electromagnetic means.

7. The modular particle beam amplifier of claim 1, wherein at least one amplifier module of the modular particle beam amplifier includes a detector to provide particle beam focus and alignment information to the focus lens of the at least one amplifier module.

8. The modular particle beam amplifier of claim 1, wherein the modular particle beam amplifier includes at least one tilt unit between amplifier modules to provide a mechanical alignment function.

9. The modular particle beam amplifier of claim 1, wherein each amplifier module in the plurality of amplifier modules is electrically isolated from the other amplifier modules in the plurality of amplifier modules except for through the distributed DC power generator.

10. The modular particle beam amplifier of claim 1, wherein at least one amplifier module in the plurality of amplifier modules wirelessly communicates with at least one other amplifier module in the plurality of amplifier modules.

11. A distributed DC power generator for a modular particle beam amplifier including a plurality of DC generator cells connected in series to each other and a plurality of power taps at different points between the DC generator cells;
wherein the plurality of DC generator cells is physically arranged in a serpentine arrangement of connected rows with a narrow end gap and a wide end gap between each adjacent row such as to minimize a physical length of the distributed DC power generator.

12. The distributed DC power generator of claim 11, wherein the plurality of power taps is arranged to provide specific voltage and current values between each sequential pair of power taps.

13. The distributed DC power generator of claim 11, wherein at least one DC generator cell in the plurality of DC generator cells is a solar cell photodiode that generates power when illuminated by natural or artificial sources of light.

14. The distributed DC power generator of claim 13, wherein the solar cell photodiode is composed of at least one of silicon, gallium arsenide, Copper Indium Galium Selenide (CIGS), and any other photovoltaic magnetic means.

15. The distributed DC power generator of claim 11, wherein at least one DC generator cell in the plurality of DC generator cells is a rectenna that generates power when it receives radio frequency energy of a particular frequency.

16. The distributed DC power generator of claim 11, wherein the distributed DC generator cell is mounted on an insulating substrate comprised of at least one non-conductive material.

17. The distributed DC power generator of claim 16, wherein the minimum distance of the narrow end gap is set by a breakdown voltage of the insulating substrate and the voltage difference between two adjacent DC generator cells, and wherein the minimum distance of the wide end gap is set by the breakdown voltage of the insulating substrate and a highest voltage difference between two rows of DC generator cells.

18. The distributed DC power generator of claim 16, wherein the narrow end gap and the wide end gap are equal in distance.

19. The distributed DC power generator of claim 11, wherein at least one subset of DC generator cells includes a crowbar circuit block in parallel with the at least one subset of DC generator cells, and wherein the crowbar circuit is designed to short out the at least one subset of DC generator cells under startup or error conditions.

20. The distributed DC power generator of claim 11, wherein at least one subset of DC generator cells includes a crowbar circuit block in parallel with the at least one subset of DC generator cells, and wherein the crowbar circuit is designed to short out the at least one subset of DC generator cells in order to adjust voltage levels along the length of the distributed DC power generator.

* * * * *